US007135820B2

(12) United States Patent
Shon et al.

(10) Patent No.: US 7,135,820 B2
(45) Date of Patent: Nov. 14, 2006

(54) VANE STRUCTURE OF MAGNETRON

(75) Inventors: Jong-Chull Shon, Suwon (KR); Boris V. Rayskiy, Suwon (KR); Hyun-Jun Ha, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 7 days.

(21) Appl. No.: 10/740,827

(22) Filed: Dec. 22, 2003

(65) Prior Publication Data

US 2004/0239255 A1 Dec. 2, 2004

(30) Foreign Application Priority Data

May 29, 2003 (KR) ...................... 10-2003-0034550

(51) Int. Cl.
*H01J 25/50* (2006.01)
*H05B 6/64* (2006.01)
*C23C 14/00* (2006.01)

(52) U.S. Cl. ............................... 315/39.51; 315/39.67; 219/756; 219/748; 204/298.19

(58) Field of Classification Search ............. 315/39.51, 315/39.67, 39.69, 39.71, 39.55, 39.59; 219/756–758, 219/748, 749, 761
See application file for complete search history.

(56) References Cited

U.S. PATENT DOCUMENTS

| | | | | |
|---|---|---|---|---|
| 4,028,583 | A | 6/1977 | Bigham | 315/39.69 |
| 5,003,223 | A * | 3/1991 | Oguro | 315/39.75 |
| 5,350,905 | A * | 9/1994 | Choi | 219/761 |
| 6,841,940 | B1 * | 1/2005 | Brady et al. | 315/39.69 |
| 6,847,023 | B1 * | 1/2005 | Han et al. | 219/756 |

* cited by examiner

*Primary Examiner*—Tuyet Thi Vo
(74) *Attorney, Agent, or Firm*—Staas & Halsey LLP

(57) ABSTRACT

A magnetron includes semi-circularly shaped electric field adjusting grooves provided on surfaces of outer ends of vanes brought into contact with an inner surface of a positive polar body to make distribution of an electric field uniform on the surfaces of the outer ends of the vanes. Accordingly, the electric field becomes uniform by the electric field adjusting grooves provided on the surfaces of the outer ends of the vanes, so that generation of undesirable harmonics is suppressed.

8 Claims, 4 Drawing Sheets

VANE STRUCTURE OF MAGNETRON

CROSS-REFERENCE TO RELATED APPLICATIONS

This application claims the benefit of Korean Application No. 2003-34550, filed May 29, 2003, in the Korean Intellectual Property Office, the disclosure of which is incorporated herein by reference.

BACKGROUND OF THE INVENTION

1. Field of the Invention

The present invention relates, in general, to a magnetron and, more particularly, to a magnetron, in which a plurality of vanes positioned between a positive polar body and a negative polar section are radially arranged toward a central axis of the positive polar body, thereby generating microwaves.

2. Description of the Related Art

In general, magnetrons are high-frequency generators, and are widely used to generate microwaves in home appliances, such as microwave ovens, as well as in industrial applications, such as high-frequency heating apparatuses, particle accelerators and radars. In a magnetron, a plurality of vanes are arranged in a cylindrically shaped positive polar body toward a central axis of the positive polar body, and a negative polar section to emit thermions is positioned in the central axis of the positive polar body.

When power is supplied from an external power supply unit to the negative polar section, a filament of the negative polar section is heated and then the thermions are continuously emitted from the heated filament, so that a series of thermions are formed. Thereafter, the series of thermions are brought into contact with surfaces of inner ends of the vanes, after rotating around the filament and moving toward the surfaces of the inner ends of the vanes under the influence of an electric field and a magnetic field formed in an activating space defined between the filament and vanes. Thus, the series of thermions generate an electrical potential difference caused by alternating polarities in every two neighboring vanes. Accordingly, oscillations are continuously generated by electrical potential differences of alternating polarities in a plurality of resonant circuits formed between the positive polar body and the plurality of vanes, so that microwaves corresponding to a rotation speed of the series of thermions are generated.

The two neighboring vanes and a portion of the positive polar body connecting the two neighboring vanes to each other form a resonant circuit. When the magnetron is operated, electric charges move through the two neighboring vanes and the portion of the positive polar body connecting the two neighboring vanes to each other, and a movement direction of the electric charges is periodically and alternately changed. A frequency of the microwaves generated in the magnetron is determined by an alternation period of the movement direction of the electric charges.

When the electric charges move through the two neighboring vanes and the portion of the positive polar body during the operation of the magnetron, undesirable harmonics may be generated in the microwaves generated in the magnetron if a distribution of an electric field is not uniform on surfaces of outer ends of the vanes.

SUMMARY OF THE INVENTION

Accordingly, it is an aspect of the present invention to provide a magnetron, in which a construction of outer ends of vanes brought into contact with a positive polar body is improved to make a distribution of an electric field uniform, thereby decreasing generation of undesirable harmonics.

Additional aspects and advantages of the invention will be set forth in part in the description which follows and, in part, will be obvious from the description, or may be learned by practice of the invention.

The foregoing and/or other aspects of the present invention are achieved by providing a magnetron including a positive polar body, a plurality of vanes connected to an inner surface of the positive polar body, radially arranged toward a central axis of the positive polar body, and each provided with at least one groove that is provided on a surface of an outer end of each of the vanes brought into contact with the inner surface of the positive polar body. The magnetron also includes a negative polar section provided on the central axis of the positive polar body, an antenna connected to one of the plurality of vanes, and magnetic materials to form a magnetic field in the positive polar body.

BRIEF DESCRIPTION OF THE DRAWINGS

The above and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
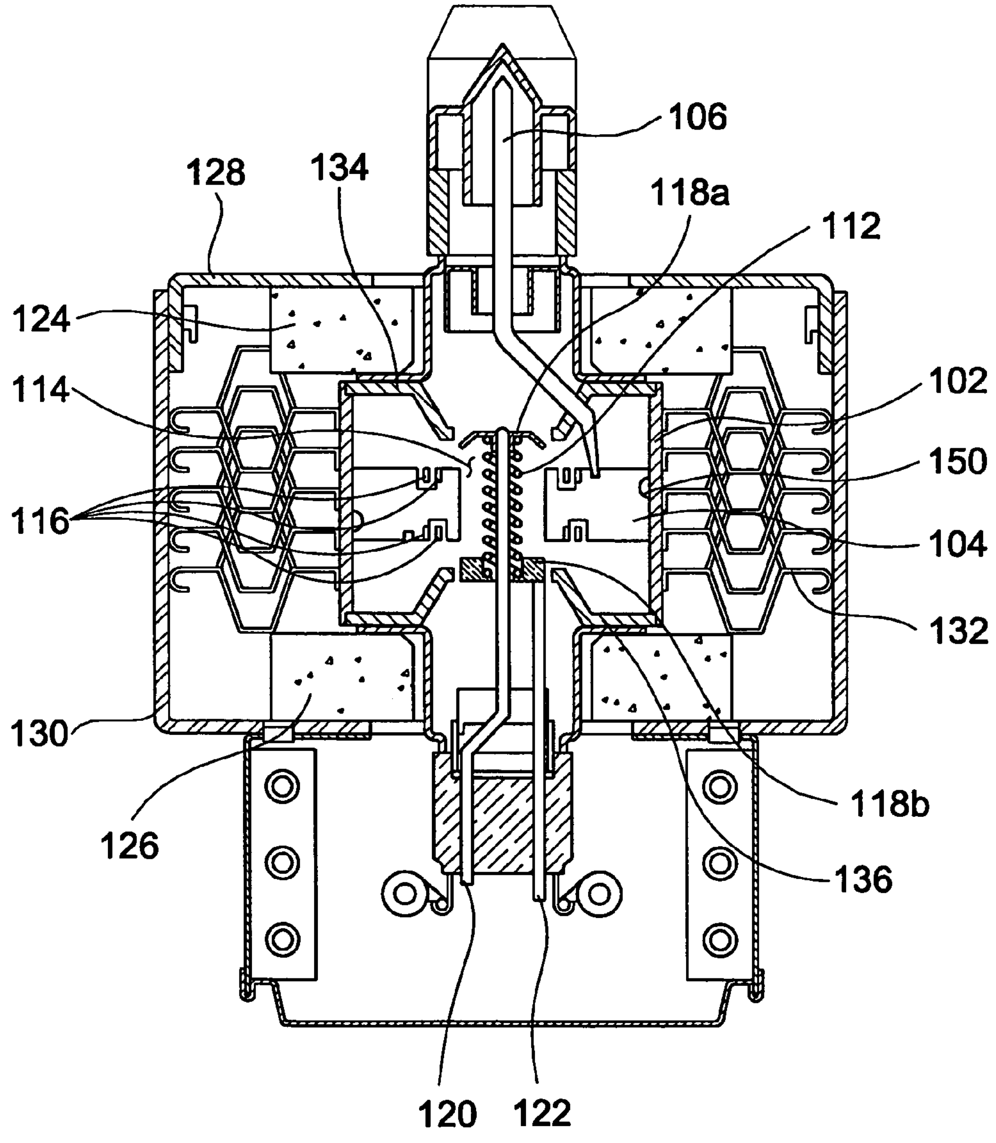
FIG. 1 is a sectional view of a magnetron, according to an embodiment of the present invention.

Reference will now be made in detail to the present preferred embodiments of the present invention, examples of which are illustrated in the accompanying drawings, wherein like reference numerals refer to like elements throughout.

Hereinafter, a magnetron will be described with reference to FIGS. 1 through 4, according to an embodiment of the present invention. FIG. 1 is a sectional view of a magnetron, according to the embodiment of the present invention. As shown in FIG. 1, in the magnetron of the present invention, a plurality of vanes 104, which constitute a positive polar section together with a positive polar body 102, are radially arranged at regular intervals toward a central axis of the positive polar body 102, thus forming resonant circuits. An antenna 106 is connected to one of the vanes 104 to lead microwaves to the outside. Semi-circularly shaped electric field adjusting grooves 150 are provided on surfaces of outer ends of the vanes 104 brought into contact with the positive polar body 102. The electric field adjusting grooves 150 allow a distribution of an electric field to be uniform in the vanes 104. Additionally, the vanes 104 are arranged to be alternately connected to one another by two straps 116 placed in each of upper and lower portions of the vanes 104.

A negative polar section, including a coil spring-shaped filament 112, to emit thermions at a high temperature is disposed in a central axis of the positive polar body 102, and an activating space 114 is defined between the filament 112 and inner ends of the vanes 104.

An upper shield 118*a* and a lower shield 118*b* are attached onto a top and a bottom of the filament 112, respectively. A center lead 120 is fixedly welded to a bottom of the upper shield 118*a* while being passed through a through hole of the lower shield 118*b* and the filament 112. A side lead 122 is welded to a bottom of the lower shield 118*b*. The center lead 120 and the side lead 122 are electrically connected to an external power source (not shown), and form an electric field in the activating space 114 defined between the filament 112 and the inner ends of the vanes 104.

An upper permanent magnet 124 and a lower permanent magnet 126 are attached onto a top and bottom of the positive polar section, respectively, with opposite magnetic poles of the upper and lower permanent magnets 124 and 126 facing each other. The permanent magnets 124 and 126 provide a magnetic flux to the activating space 114. An upper pole piece 134 and a lower pole piece 136 are disposed in upper and lower portions of the positive polar body 102, respectively, to lead the magnetic flux generated by the upper and lower permanent magnets 124 and 126 into the activating space 114.

Upper and lower yokes 128 and 130 are disposed to surround the above-described elements. The upper and lower yokes 128 and 130 are magnetically connected to each other and form a magnetic circuit that connects the upper permanent magnet 124 and the lower permanent magnet 126 to each other.

The thermions emitted from the filament 112 collide with the surfaces of the inner ends of the vanes 104 of the positive polar section, so that the temperatures of the vanes 104 and the positive polar body 102 are greatly increased. Heat radiation pins 132 connect the high temperature, positive polar body 102 to the lower yoke 130, and therefore emit heat generated by the positive polar section to the outside through the lower yoke 130.

When power is supplied from the external power supply unit to the filament 112, the filament 112 is heated and thermions are continuously emitted from the heated filament 112, so that a series of thermions is formed. The series of thermions are brought into contact with the inner ends of the vanes 104 after rotating around the filament 112 and moving toward the inner ends of the vanes 104 under the influence of an electric field and a magnetic field formed in the activating space 114, thus generating an electrical potential difference caused by alternating polarities formed in two neighboring vanes 104. Accordingly, oscillations are continuously generated by electrical potential differences caused by alternating polarities in a plurality of resonant circuits formed between the positive polar body 102 and the plurality of vanes 104, so that microwaves corresponding to a rotation speed of the series of thermions are generated and transmitted to the outside through an antenna 106.

Figure 2:
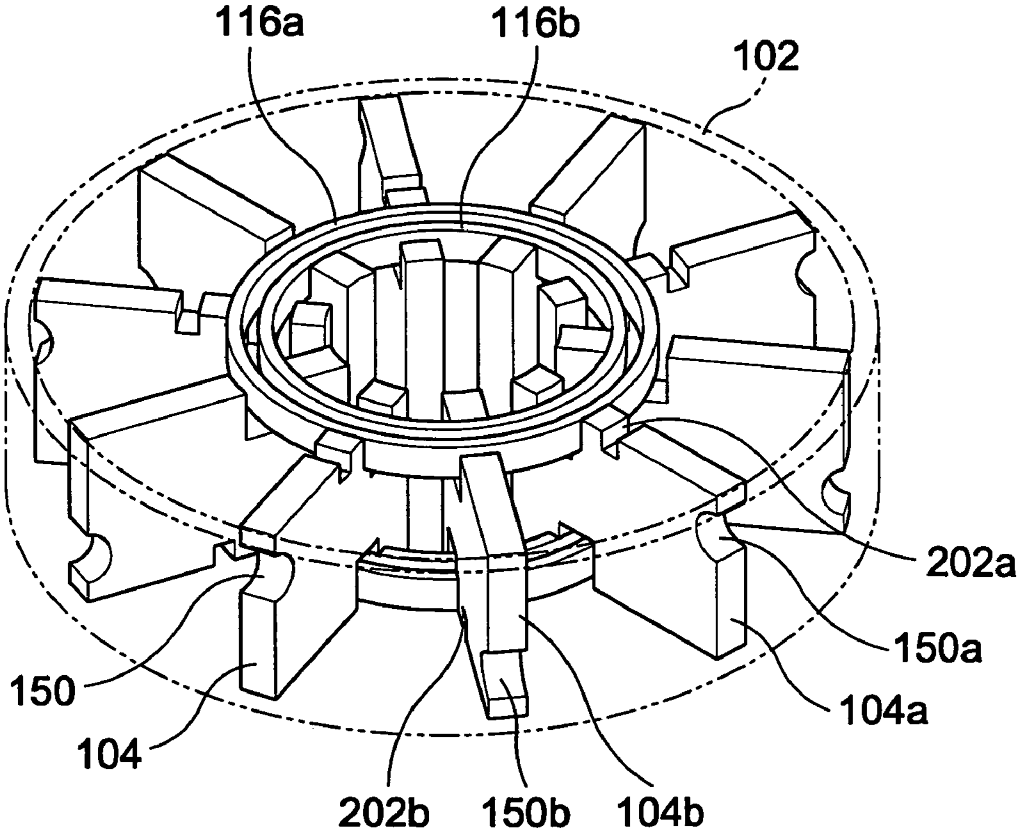
FIG. 2 is a view showing construction of a positive polar body, vanes, and straps of the magnetron, according to the embodiment of the present invention as shown in FIG. 1.

FIG. 2 is a view showing construction of the positive polar body 102, vanes 104, and straps 116*a* through 116*d* of the magnetron, according to the embodiment of the present invention as shown in FIG. 1. As shown in FIG. 2, an even number of vanes having the same shape are radially arranged so that surfaces of outer ends thereof are brought into contact with the inner surface of the cylindrically shaped positive polar body 102, and neighboring vanes 104 are arranged in an inverted relation to each other. That is, referring to two neighboring vanes 104*a* and 104*b* in FIG. 2, it is understood that the two vanes 104*a* and 104*b* are arranged to be in the inverted relation to each other. In detail, in each of the vanes 104*a*, an antenna connecting portion 202*a* is upwardly open, and an electric field adjusting groove 150*a* is positioned on an upper portion of a surface of an outer end of the vane 104*a*. In contrast, in each of the vanes 104*b*, an antenna connecting portion 202*b* is downwardly open, and an electric field adjusting groove 150*b* is positioned on a lower portion of a surface of an outer end of the vane 104*b*.

Each of the vanes 104 is electrically connected to upper straps 116*a* and 116*b* and lower straps 116*c* and 116*d*. The upper straps 116*a* and 116*b* are divided into an outer, upper strap 116*a* and an inner, upper strap 116*b*. The outer, upper strap 116*a* electrically connects odd numbered vanes 104 to each other and the inner, upper strap 116*b* electrically connects even numbered vanes 104 to each other.

Figure 3:
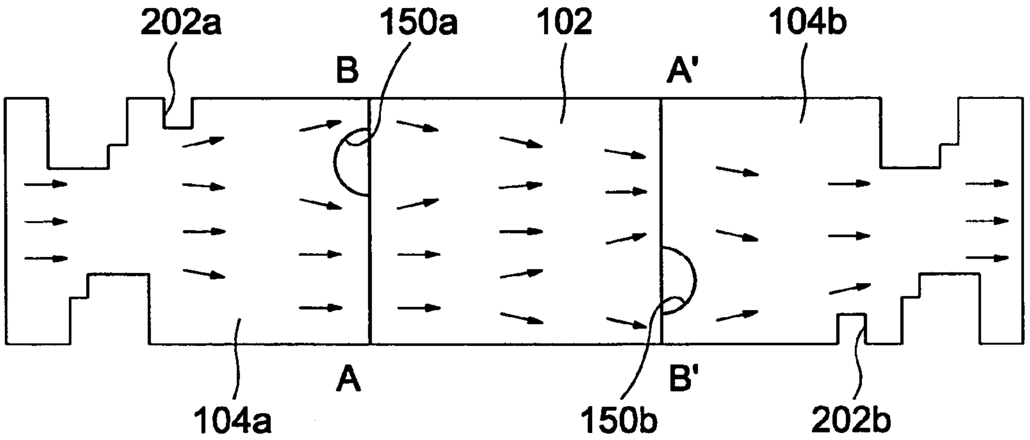
FIG. 3 is a view showing distribution of moving electric charges in two neighboring vanes and a positive polar body connecting the two vanes to each other, according to the embodiment of the present invention as shown in FIG. 2.

FIG. 3 is a view showing distribution of moving electric charges in the two neighboring vanes 104*a* and 104*b* of the magnetron and the positive polar body 102 connecting the two neighboring vanes 104*a* and 104*b* to each other, according to the embodiment of the present invention as shown in FIG. 2. This drawing is a development view, in which the two vanes 104*a* and 104*b* are spread around a portion of the positive polar body 102 in a horizontal direction while being viewed from the central axis of the positive polar body 102 to the positive polar body 102.

As shown in FIG. 3, the electric charges moving through the upper portion of the vane 104*a* move toward the positive polar body 102 while being dispersed above and below the electric field adjusting groove 150*a* provided on the vane 104*a*. The dispersed electric charges are gathered and then move to the neighboring vane 104*b*. Referring to paths of the moving electric charges in the vicinity of the electric field adjusting groove 150*a* provided on the vane 104*a*, a path of the moving electric charges is longer than those of electric charges in other parts of the vane 104*a*. Thus, a magnitude of the electric field is decreased in the vicinity of the electric field adjusting groove 150*a*. Due to uniform construction of the two vanes 104*a* and 104*b*, the operations of the electric field adjusting grooves 150*a* and 150*b* are the same in the case where the electric charges move in a reverse direction.

Figure 4:
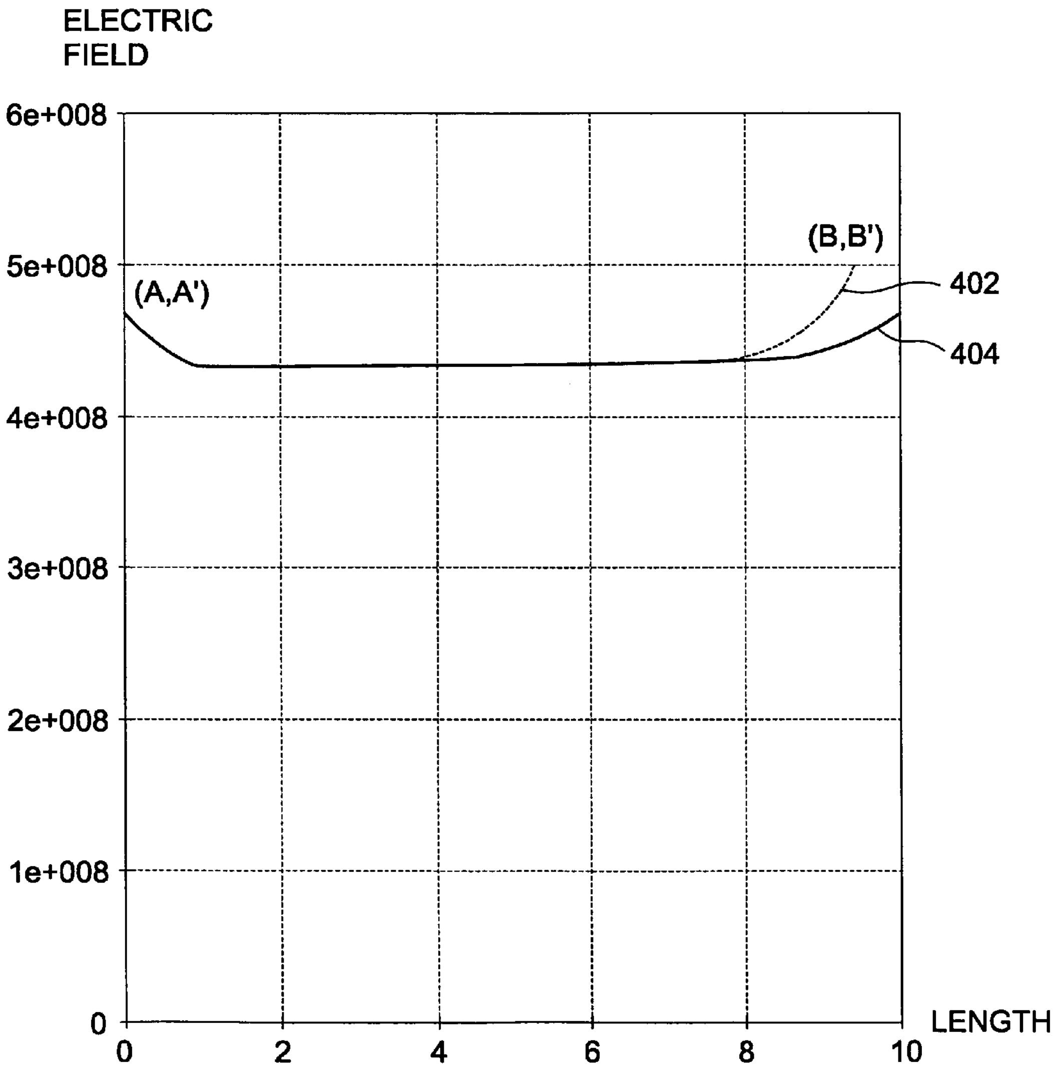
FIG. 4 is a characteristic curve of a distribution of electric fields along lengths of surfaces of outer ends of the vanes in the magnetron, according to the embodiment of the present invention as shown in FIG. 1.

FIG. 4 is a characteristic curve of a distribution (magnitudes) of electric fields along lengths of the surfaces of the outer ends of the vanes 104*a* and 104*b* in the magnetron, according to the embodiment of the present invention as shown in FIG. 1. In FIG. 3, upper and lower ends of the outer ends of the vanes 104*a* and 104*b* are represented by B and A', and A and B', respectively. In a characteristic curve 402 representing a distribution of an electric field on surfaces of outer ends of conventional vanes having no electric field adjusting grooves, it may be understood that the distribution of the electric field is not uniform and a high electric field is formed at the upper end B and the lower end B'. Due to non-uniformity of the distribution of the electric field, harmonics are generated. In contrast, in a characteristic curve 404 representing the distribution of an electric field on the surfaces of the outer ends of the vanes 104*a* and 104*b* having electric field adjusting grooves 150*a* and 150*b*, it is understood that the distribution of the electric field on the surfaces of the outer ends extending from A to B and from A' to B' is uniform.

As apparent from the above description, the present invention provides a microwave oven, in which construction of the outer ends of the vanes are improved, thereby suppressing generation of undesirable harmonic waves.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A magnetron, comprising:

a positive polar body; and a plurality of vanes connected to an inner surface of the positive polar body, radially arranged toward a central axis of the positive polar body, and each of the vanes provided with at least one groove provided on a surface of an outer end of each of the vanes brought into contact with the inner surface of the positive polar body, wherein the grooves provided on the vanes allow a uniform electric field to be formed on the surfaces of the outer ends of the vanes.

2. The magnetron according to claim 1, wherein the groove is semi-circularly shaped.

3. A magnetron, comprising:

a positive polar body; and a plurality of vanes connected to an inner surface of the positive polar body, radially arranged toward a central axis of the positive polar body, and each of the vanes provided with at least one groove provided on a surface of an outer end of each of the vanes brought into contact with the inner surface of the positive polar body, wherein the grooves provided on the vanes allow a speed of moving electric charges moving through two neighboring vanes of the plurality of vanes and a portion of the positive polar body positioned between the two neighboring vanes to be uniform over the surfaces of the outer ends of the two vanes.

4. A magnetron, comprising:

a positive polar body; and a plurality of vanes connected to an inner surface of the positive polar body, radially arranged toward a central axis of the positive polar body, and each of the vanes provided with at least one groove provided on a surface of an outer end of each of the vanes brought into contact with the inner surface of the positive polar body, wherein the groove is provided on a portion where a greatest electric field is generated on the surface of the outer end of the vane while microwaves are generated.

5. A magnetron, comprising:

a positive polar body; and a plurality of vanes connected to an inner surface of the positive polar body, radially arranged toward a central axis of the positive polar body, and each of the vanes provided with at least one groove provided on a surface of an outer end of each of the vanes brought into contact with the inner surface of the positive polar body, wherein each of the vanes further comprises:

an antenna connecting portion selectively provided on upper or lower surfaces of the vane to be connected to an antenna, and the groove is selectively provided on an upper or a lower portion of the surface of the outer end of the vane depending on a position where the antenna connecting portion is provided.

6. A magnetron, comprising:

a positive polar body;

a plurality of vanes connected to an inner surface of the positive polar body, radially arranged toward a central axis of the positive polar body, and each provided with at least one groove provided on a surface of an outer end of each of the vanes brought into contact with the inner surface of the positive polar body;

a negative polar section provided on the central axis of the positive polar body;

an antenna connected to one of the plurality of vanes; and magnetic materials to form a magnetic field in the positive polar body, wherein the grooves provided on the vanes allow a uniform electric field to be formed on the surfaces of the outer ends of the vanes.

7. A magnetron, comprising:

a positive polar body; and a plurality of vanes connected to the positive polar body, and each of the vanes provided with at least one groove on an end thereof which contacts the positive polar body so that a uniform electric field is formed at an outer end surface of the vanes.

8. The magnetron according claim 7, wherein a magnitude of the electric field is decreased in a vicinity of the groove of vanes, to suppress a generation of undesirable harmonics in the magnetron.

* * * * *